(12) United States Patent
Liu et al.

(10) Patent No.: US 6,706,601 B1
(45) Date of Patent: Mar. 16, 2004

(54) METHOD OF FORMING TINY SILICON NITRIDE SPACER FOR FLASH EPROM BY USING DRY+WET ETCHING TECHNOLOGY

(75) Inventors: Hung-Hsin Liu, Hsin-Chu (TW); Kwang-Chen Wu, Taipei (TW); How-Cheng Tsai, Kaoshiung (TW); Yuan-Ko Hwang, Huantien (TW); Shih-Shun Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 6 days.

(21) Appl. No.: 10/392,119

(22) Filed: Mar. 19, 2003

(51) Int. Cl.⁷ .............................................. H01L 21/336
(52) U.S. Cl. ..................................................... 438/266
(58) Field of Search ............................... 438/266, 257, 438/303

(56) References Cited

U.S. PATENT DOCUMENTS

| | | | |
|---|---|---|---|
| 5,552,331 A | * 9/1996 | Hsu et al. | 437/40 |
| 5,879,993 A | 3/1999 | Chien et al. | 438/266 |
| 5,915,178 A | * 6/1999 | Chiang et al. | 438/266 |
| 6,001,690 A | 12/1999 | Chien et al. | 438/266 |
| 6,046,086 A | 4/2000 | Lin et al. | 438/264 |
| 6,069,042 A | 5/2000 | Chien et al. | 438/266 |
| 6,074,914 A | 6/2000 | Ogura | 438/257 |
| 6,380,030 B1 | * 4/2002 | Chen et al. | 438/257 |
| 6,465,841 B1 | * 10/2002 | Hsieh et al. | 257/321 |

* cited by examiner

Primary Examiner—David Nelms
Assistant Examiner—Quoc Hoang
(74) Attorney, Agent, or Firm—George O. Saile; Stephen B. Ackerman

(57) ABSTRACT

A method of forming very small silicon nitride spacers in split-gate flash EPROMs is disclosed which prevent the occurrence of "write disturb", unwanted reverse tunneling, or erasing. This is accomplished by forming spacers with well controlled dimensions and well defined shapes through a judicious combination of dry etch with wet over-etch technique. The wet etch along with the dry etch widens the process window from a few seconds to several minutes so that the small dimensioned silicon nitride spacers can be better controlled than it has been possible in the past. In a second embodiment, the step of over-etching of the spacers is combined with the step of stripping off of an implant photomask, thus, shortening the manufacturing product cycle.

41 Claims, 6 Drawing Sheets

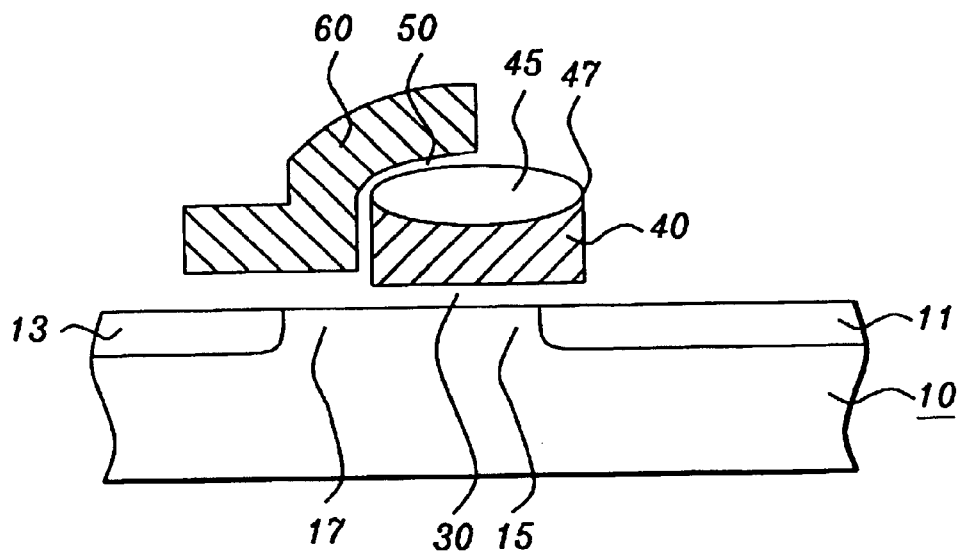
FIG. 1 – Prior Art

METHOD OF FORMING TINY SILICON NITRIDE SPACER FOR FLASH EPROM BY USING DRY+WET ETCHING TECHNOLOGY

BACKGROUND OF THE INVENTION (1) Field of the Invention

The present invention relates to split-gate memory cells used in flash EEPROMs (Electrically Erasable Programmable Read Only Memories), and in particular, to a method of forming a tiny silicon nitride spacer by using a judicious combination of dry and wet etch in order to provide a better process window.

(2) Description of the Related Art

Silicon nitride spacer technology is widely used in split gate non-volatile memory cells such as flash EPROMs. A tiny spacer structure is formed on tunnel oxide layer adjacent to the sidewall of floating gate electrode to prevent write disturbance that is caused by reverse tunneling. The nitride spacer is usually performed by anisotropic dry etching. However, it is difficult to control and maintain the etch rate and uniformity in dry etching because the process window of spacer etching is very narrow, namely, about 3 seconds for forming and shaping a tiny spacer, which may be no larger than 250 angstroms (Å) in height. Such a short etch time and the nonuniformity in the nitride film itself makes it very difficult to form tiny nitride spacers of controlled dimensions. A poorly defined spacer will cause, what is known in the art as "write disturb", or, unwanted reverse tunneling, or erasing. Also, the endurance (the number of times the cell can be written and erased) is degraded as well as the erase and program (writing) speed of the cell. It is disclosed later in the embodiments of the present invention a method of opening up the etching process window from tens of seconds to several minutes with the attendant result of having much better controlled tiny silicon nitride spacers, and hence improved flash EPROM.

Most conventional flash-EEPROM cells use a double-polysilicon (poly) structure of which the well-known split-gate cell is shown in FIG. 1. There, a MOS transistor is formed on a semiconductor substrate (10) having a first doped region (11), a second doped region (13), a channel region (15), a gate oxide. (30), a floating gate (40), intergate dielectric layer (50) and control gate (60). Substrate (10) and channel region (15) have a first conductivity type, and the first (11) and second (13) doped regions have a second conductivity type that is opposite the first conductivity type.

As seen in FIG. 1, the first doped region, (11), lies within the substrate. The second doped region, (13), lies within substrate (10) and is spaced apart form the first doped region (11). Channel region (15) lies within substrate (10) and between first (11) and second (13) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

The programming and erasing of an EEPROM is accomplished electrically and in-circuit by using Fowler-Nordheim (F-N) tunneling as is well known in prior art. Basically, a sufficiently high voltage is applied to the control gate and source while the drain is providing a constant flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the source to a sufficiently high value of about 12 volts so that the floating gate will couple at about 8 volts. As the electronic charge builds up on the floating gate, the electric field is reduced, which reduces the electron flow. When, finally, the high voltage is removed, the floating gate remains charged to a value lower than the threshold voltage of a logic high that would turn it off. Since tunneling process is reversible, the floating gate can be erased by raising the control gate voltage and grounding the drain and source, thereby causing the stored charge on the floating gate to flow to the control gate by Fowler-Nordheim tunneling. Of importance in the tunneling region are the quality and the thinness of the tunneling oxide separating the floating gate from the substrate. Inadvertent reverse tunneling, or erasure, for example, may occur if the tunnel oxide is degraded, or the spacer formed between the floating gate and the control gate is poorly shaped.

In prior art, spacers are formed in various, different ways. Chien, et al., in U.S. Pat. No. 5,879,993 form a spacer structure adjacent to the sidewall of a floating gate electrode with a top surface and sidewalls, the floating gate electrode being formed on a silicon oxide dielectric layer, and the silicon oxide dielectric layer being formed on the top surface of a semiconductor substrate. The method includes the following steps: form a cap layer on the floating gate electrode, and a blanket tunnel oxide on the device; forming an inner dielectric, spacer layer over the device including the cap layer and the sidewalls thereby with conforming sidewalls, and an outer dielectric, spacer layer over the inner dielectric, spacer layer including the conforming sidewalls; etching partially the outer dielectric, spacer layer with a dry etch to form an outer dielectric spacer adjacent to the conforming sidewalls; partially etching more of the outer dielectric, spacer layer with a wet etch to expose a portion of the conforming sidewalls of the inner dielectric, spacer layer; etching the portion of the inner dielectric, spacer layer unprotected by the outer dielectric spacer before forming interelectrode dielectric layers and the control gate electrode.

Another method of forming spacers for flash EEPROM devices is disclosed by Chien, et al., in U.S. Pat. No. 6,001,690. A silicon nitride layer is formed over the floating gate in a memory cell. In one embodiment, a full isotropic/anisotropic etching of a particular recipe is performed on the nitride layer, while in a second embodiment a partial isotropic/anisotropic etching is followed by full anisotropic etching, using a different recipe.

In still another U.S. Pat. No. 6,069,042, Chien, et al., teach a method for forming a multi-layer spacer (MLS) for flash EPROM devices. A composite tetraethylorthosilicate-silicon nitride (TEOS/$Si_3N_4$) layer is deposited over the floating gate and anisotropically etched to form the MLS.

On the other hand, Lin, et al., provide a method for forming a split-gate flash memory cell in U.S. Pat. No. 6,046,086, where an extra thin nitride layer is formed over the primary gate oxide layer, while Ogura, in U.S. Pat. No. 6,074,914, teaches a method of fabricating an electrically programmable read only memory device, which consists of a control/word gate and a floating gate on the side wall of the control gate.

It is disclosed in the present invention a different method of forming a spacer in a split-gate flash memory cell by judiciously combining dry etch with wet etch.

SUMMARY OF THE INVENTION

It is therefore an object of this invention to provide method of forming very small silicon nitride spacers in split-gate flash EPROM cells in order to prevent the occurrence of "write disturb", unwanted reverse tunneling, or erasing.

It is another object of this invention to provide a method of forming small nitride spacers with well-controlled dimensions and well-defined shapes through a judicious combination of dry+wet over etch technique.

It is still another object of the present invention to provide a method where the process window is big enough to easily control the dimension and shape of the very small silicon nitride spacers that are useful in split gate flash memory cells.

It is yet another object of the present invention to provide a method of forming tiny silicon nitride spacers with an improved product turn around time by combining the etching of the tiny spacers with the step of removing the photomask after the performing of the voltage threshold implant.

These objects are accomplished by providing a substrate having a plurality of active and field regions defined; forming a gate oxide layer over said substrate; forming a first polysilicon layer over said gate oxide layer; forming a nitride hard mask layer over said first polysilicon layer; etching the nitride hard mask layer to define floating gate area; forming a poly oxide layer over said floating gate structure; etching said first polysilicon layer to define a floating gate structure using the poly oxide hard mask; forming a tunnel oxide layer over said substrate, including over said polyoxide layer; forming a silicon nitride layer over said tunnel oxide layer; performing a dry etch of said silicon nitride (SiN) layer to form first SiN spacers along the vertical sidewalls of said floating gate structure; performing a wet over-etch of said first SiN spacers to form tiny second SiN spacers along the vertical sidewalls of said floating gate structure; forming a voltage threshold (VT)-implant photomask over said substrate; performing a VT-implant; removing said VT-implant photomask; forming a low voltage threshold (VTE)-implant photomask; performing a VTE-implant; removing said VTE-implant photomask; forming an intergate oxide layer over said floating gate; forming a second polysilicon layer over said poly oxide layer; and etching said second polysilicon layer to form a control gate over said intergate poly oxide layer.

These objects are further accomplished in a second embodiment providing a substrate having a polysilicon floating gate and a polyoxide formed thereon; forming tunnel oxide over said substrate, including over said polyoxide layer; forming a silicon nitride (SiN) layer over said substrate, including over said polyoxide layer; dry etching said SiN layer to form first SiN spacers along the vertical sidewalls of said floating gate; forming a voltage threshold (VT)-implant photomask over said substrate; performing a VT-implant; performing wet etch to remove said VT-implant photomask and continuing to wet over-etch said SiN spacers to form tiny second SiN spacers; forming a low voltage threshold (VTE)-implant photomask; performing a VTE-implant; removing said VTE-implant photomask; forming an intergate oxide layer over said floating gate; forming a second polysilicon layer over said poly oxide layer; and etching said second polysilicon layer to form a control gate over said intergate poly oxide layer.

BRIEF DESCRIPTION OF THE DRAWINGS

FIG. 1 is a cross-sectional view of a portion of a semiconductor substrate showing a split-gate flash memory cell of prior art.

DESCRIPTION OF THE PREFERRED EMBODIMENTS

Figure 2A:
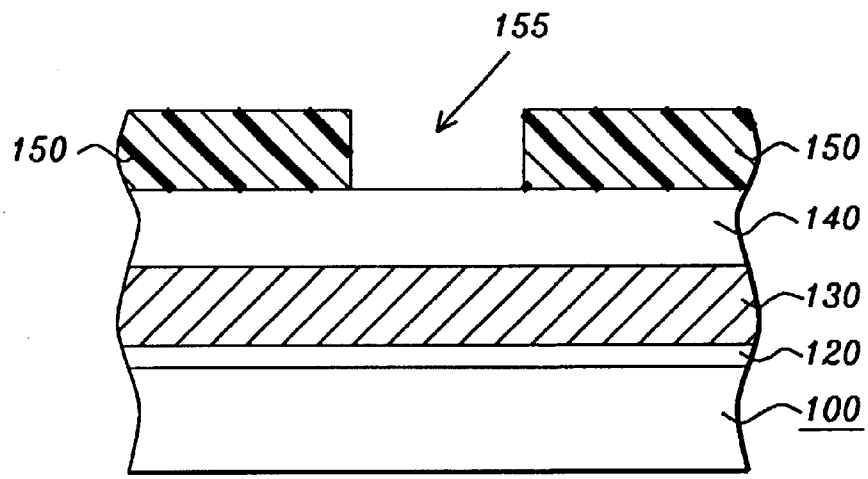
FIG. 2a is a cross-sectional view of a portion of a semiconductor substrate showing the patterning of a first photoresist layer formed over a layer of nitride overlying first polysilicon layer, which in turn is formed over the gate oxide layer, according to this invention.

Referring now to the drawings, in particular to FIGS. 2a–2i and FIGS. 3a–3b, there is shown steps of forming very small silicon nitride spacers for a split-gate flash memory cell by a judicious combination of dry etch and wet etch techniques. The dry+wet etch method opens up the conventional dry etch only process window (that is, process etch time) up to one hundred times or more so that the etching of very small dimensions can be controlled much more precisely. It is shown below in the embodiments of the present invention that a particular wet etch recipe must also be used in order to attain the wider process windows. The resulting well defined and well shaped silicon nitride spacers enhance the endurance of the split-gate flash memory cell, as well as preventing the occurrence of "write disturb" phenomenon, or the unwanted reverse tunneling and erasing that is well known in the art.

In FIG. 2a, gate oxide layer (120) is formed over substrate (100), preferably silicon. Gate oxide (120) can be formed by thermal oxidation process at a temperature between about 700 to 1000° C. Alternatively, the gate oxide can be formed by an atmospheric or low pressure chemical vapor deposition (LPCVD) process as is well known. Gate oxide layer; (120) has a thickness between about 50 to 120 angstroms (Å).

Figure 2B:
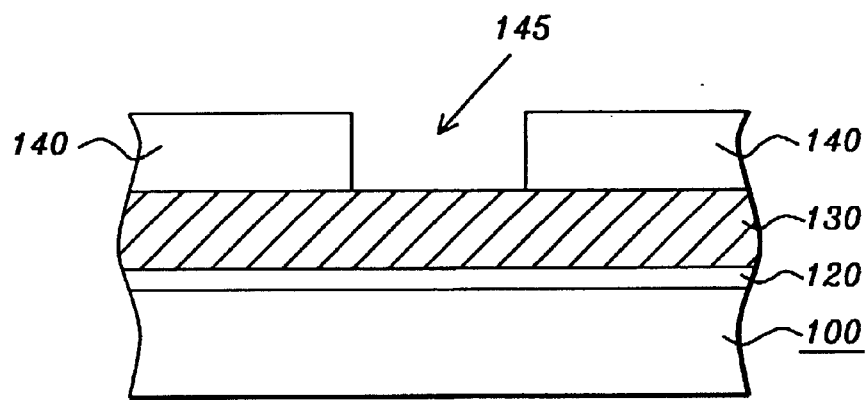
FIG. 2b is a cross-sectional view of a portion of a semiconductor substrate showing the forming of an opening in the nitride layer of FIG. 2a and exposing portion of the first polysilicon layer, according to this invention.

Next, first polysilicon layer (130) is formed over the gate oxide layer through reduction of $SiH_4$ using LPCVD at a temperature between about 600 to 650° C. The preferred thickness of the first layer of polysilicon is between about 1200 to 2000 Å. This is followed by forming nitride layer (140) shown in FIG. 2a by reacting dichlorosilane ($SiCl_2H_2$) with ammonia ($NH_3$) in an LPCVD at a temperature between about 600 to 800° C. The preferred thickness of the nitride layer is between about 1300 to 1700 Å. A photoresist mask (150) having patterns (155) is next formed over the nitride layer to a thickness between about 13000 to 2000 Å corresponding to areas where floating gates are to be defined also as shown in FIG. 2a. The patterns are then etched into nitride layer (140) forming openings (145) where portion, of the underlying first polysilicon layer (130) is exposed, as shown in FIG. 2b. It is preferred that the etching, of nitride layer (140) is accomplished with a recipe comprising gases $CF_4$ and $CHF_3$. Afterwards, the photoresist layer is removed by oxygen plasma ashing.

Figure 2C:
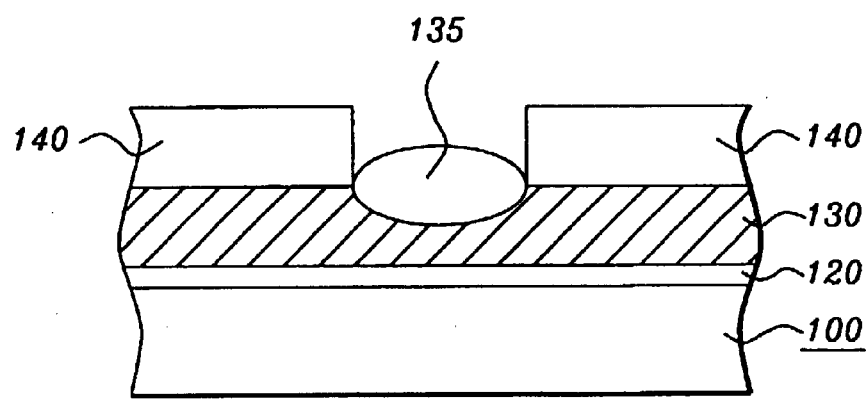
FIG. 2c is a cross-sectional view of a portion of a semiconductor substrate showing the forming of polyoxide over the exposed portion of the first polysilicon layer of FIG. 2b, according to this invention.
Figure 2D:
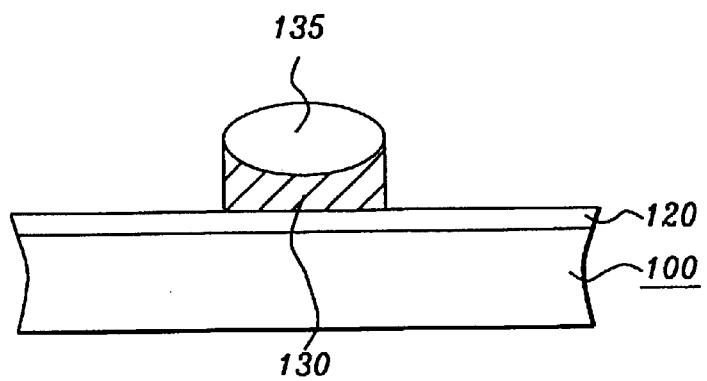
FIG. 2d is a cross-sectional view of a portion of a semiconductor substrate showing the forming of the floating gate of this invention.

Next, first polysilicon layer (130) that is exposed in the pattern openings (145) in the nitride layer is oxidized to form polyoxide (135) as shown in FIG. 2c. Subsequently, the nitride layer is removed where now polyoxide (135) serves as a hard mask to remove all the first polysilicon portions except those that are covered by the overlying polyoxide layer as shown in FIG. 2d. It is important that the sidewall of the floating gate so formed has vertical wall and that the etching of the polysilicon is accomplished with a recipe comprising gases $Cl_2$ and HBr.

Figure 2E:
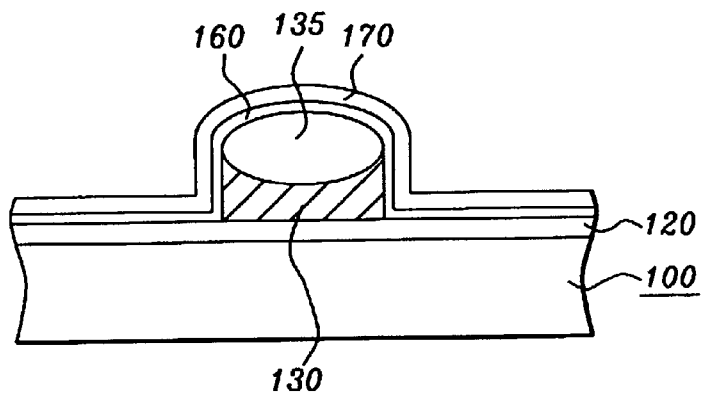
FIG. 2e is a cross-sectional view of a portion of a semiconductor substrate showing the forming of a tunnel oxide layer followed silicon nitride layer on the floating gate of this invention.

Then, tunnel oxide layer (160) is formed over the substrate, including the vertical sidewall of floating gate (130) as shown in FIG. 2e. The tunnel oxide is formed by high temperature oxide (HTO) to a thickness between about 100 to 200 Å. This is followed by forming silicon nitride $Si_3N_4$, or SiN in short, layer (170) over the tunnel oxide layer. $Si_3N_4$ is formed by reacting dichlorosilane $SiH_2Cl_2$ with ammonia $NH_3$ in an LPCVD at a temperature between about 600 to 800° C. It is preferred that the thickness of the silicon nitride layer is between about 180 to 250 Å.

Figure 2F:
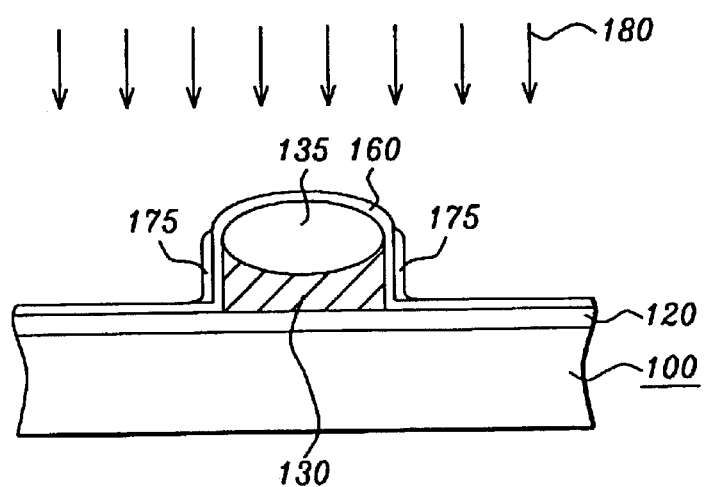
FIG. 2f is a cross-sectional view of a portion of a semiconductor substrate showing the forming of silicon nitride spacers using dry etch, according to the present invention.
Figure 2G:
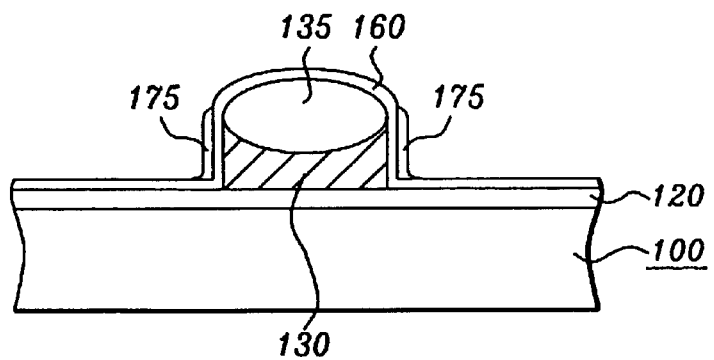
FIG. 2g is a cross-sectional view of a portion of a semiconductor substrate showing the forming of small silicon nitride spacers using dry over-etch, as currently practiced in the manufacturing line.
Figure 2H:
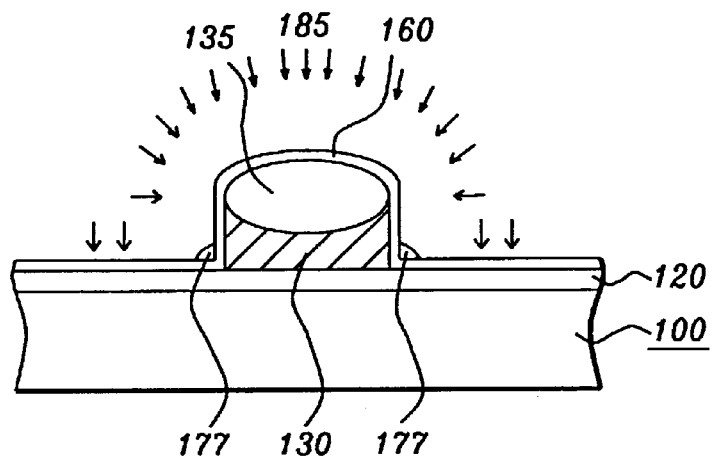
FIG. 2h is a cross-sectional view of a portion of a semiconductor substrate showing the forming of tiny silicon nitride spacers of this invention using wet over-etch, according to the present invention.

Next, SiN layer (170) is subjected to anisotropic dry etch (180) until end-point is reached, as is practiced conventionally, such that first SiN spacers (173) are formed, as shown in FIG. 2f. The dry etch recipe comprises gases $SF_6$, HBr, and $O_2$. Normally, the next step would involve continued dry over-etch in order to form very small dimensioned silicon nitride spacers. However, it has been the experience of the present manufacturing line that it is very difficult to form sustainable nitride spacers with the dry over-etch technique that is used. The resulting spacers are usually of erratic shapes and fragile as seen in reference to numeral (175) in FIG. 2g. This is primarily because the process window of dry etching time is very short, namely, about three seconds, during which time it is very difficult to control the dimensional integrity of the spacers, especially if tiny spacers are desired. Because of the fragility of the spacer formed on the vertical walls of the floating gate, the spacer as well as the adjacent interpoly oxide become degraded. Thus, the well-known programming "write disturb" occurs due to the unsatisfactory barrier to reverse tunneling provided by the ineffective silicon nitride spacers (175). Furthermore, the degraded oxide and nitride spacer contribute to the unacceptably low endurance levels as well.

It will be apparent to those skilled in the art that any means for widening the process window in forming very small spacers would be much welcomed. Hence, as a preferred embodiment and a main feature of the present invention, the first SiN spacers shown in FIG. 2f are subjected to wet over-etch, instead of the conventional dry over-etch, either in a hot phosphoric acid ($H_3PO_4$) solution, or, preferably, in a mixture comprising sulfuric acid and hydrogen peroxide ($H_2SO_4+H_2O_2$), called CR-SPM solution. It has been found that, the process window for forming tiny second silicon nitride spacers (177) of FIG. 2h with the disclosed dry+wet over-etch method has been more than tripled to ten seconds—in comparison with the three seconds of the conventional dry etch only method—in the case with hot phosphoric acid solution, and to more than one hundred times to eight minutes in the case with Carros CR-SPM solution. This is because the etch rates are 60 Å/minute for the former wet-etch, and 0.5 Å/minute for the latter. The wet over-etch is referred to in FIG. 2h with numeral (185), and a comparison of the process windows is given in the table below:

TABLE I

| Condition | Method | Proc. Wind | Improv. |
| --- | --- | --- | --- |
| Fully dry | Dry End-Point (E/P) + Over-Etch (OE) | 3 seconds | 1x |
| Dry + wet (1) | Dry E/P + $H_3PO_4$ dip | 10 seconds | >3x |
| Dry + wet (2) | Dry E/P + $H_2SO_4$ + $H_2O_2$ dip | 8 minutes | >100x |

Thus, it will be apparent that with the much improved process windows of the disclosed dry-wet etch method, the dimensions of the tiny spacers can be much better controlled. Also, because of the isotropic nature of the wet etch, the shape of the tiny spacers is more uniform than erratic as would be the case with much faster dry etch.

After the forming of the tiny second SiN spacers of the instant invention, threshold voltage (VT) adjustment is performed by first forming a VT-implant photomask (not shown), and then implanting $BF_2^+$ ions at a dosage level between about $2\times10^{11}$ to $5\times10^{11}$ atoms/cm$^2$ at energy level between about 50 to 90 KEV. Then the photomask is removed by stripping it in the CR-SPM solution.

Figure 3A:
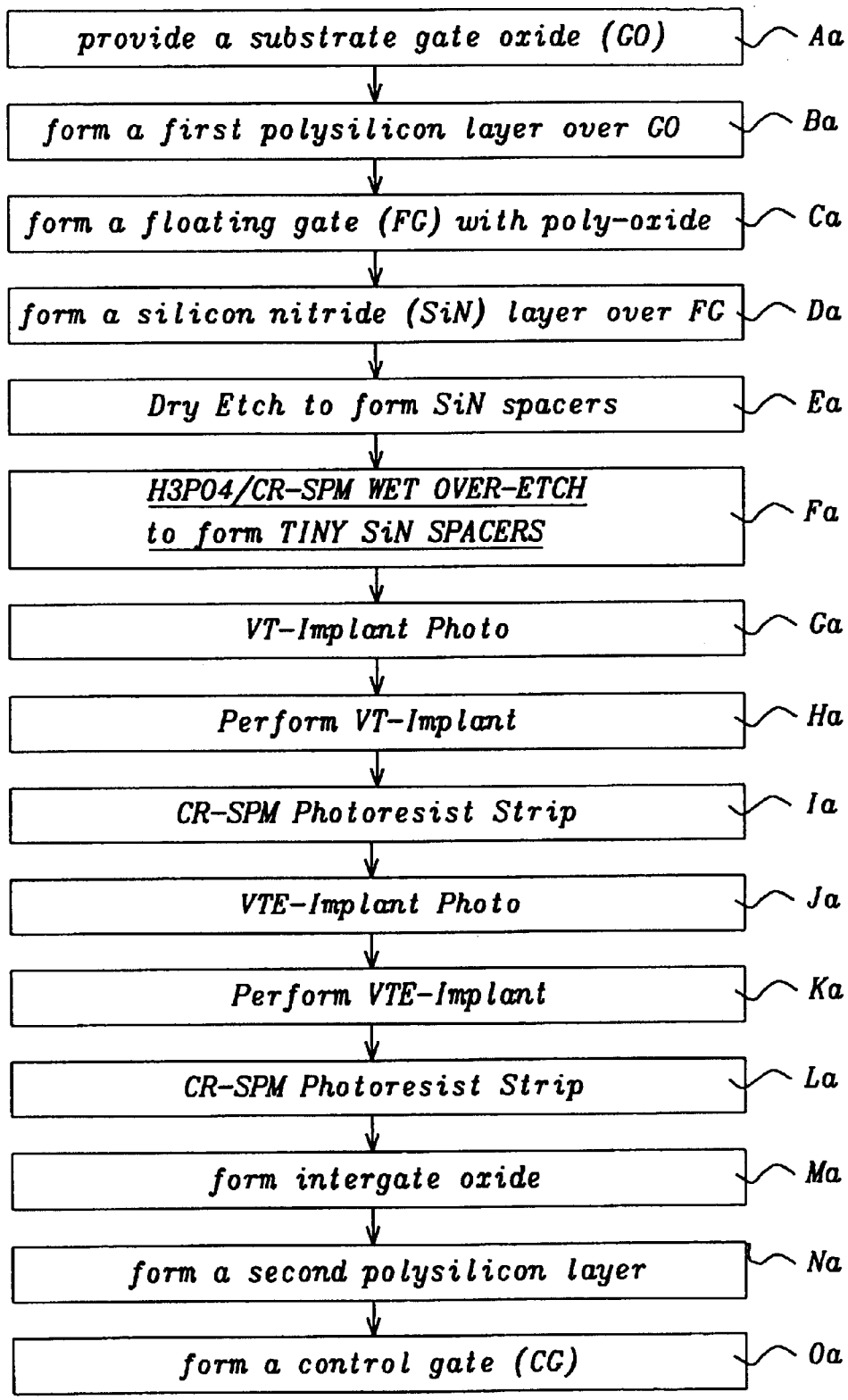
FIG. 3a is a Flow Chart showing the steps of forming tiny silicon nitride spacers for a split gate flash EPROM cell in a first embodiment where dry+wet over-etch method is used separately for over etching the spacers and then stripping off the VT-implant photomask, according to the present invention.

The above process steps are also summarized in the flow chart shown in FIG. 3a, beginning with step (Aa) and ending with step (Oa). It will be noted in the key step (Fa) of the instant invention that the same CR-SPM solution used for wet over-etch of the tiny second SiN spacers, is also used in step (Ia) for photoresist stripping of the VT-implant photomask. Hence, the two process steps can be combined to improve the product build turn-around-time. This is shown as a second embodiment in FIG. 3b.

Figure 3B:
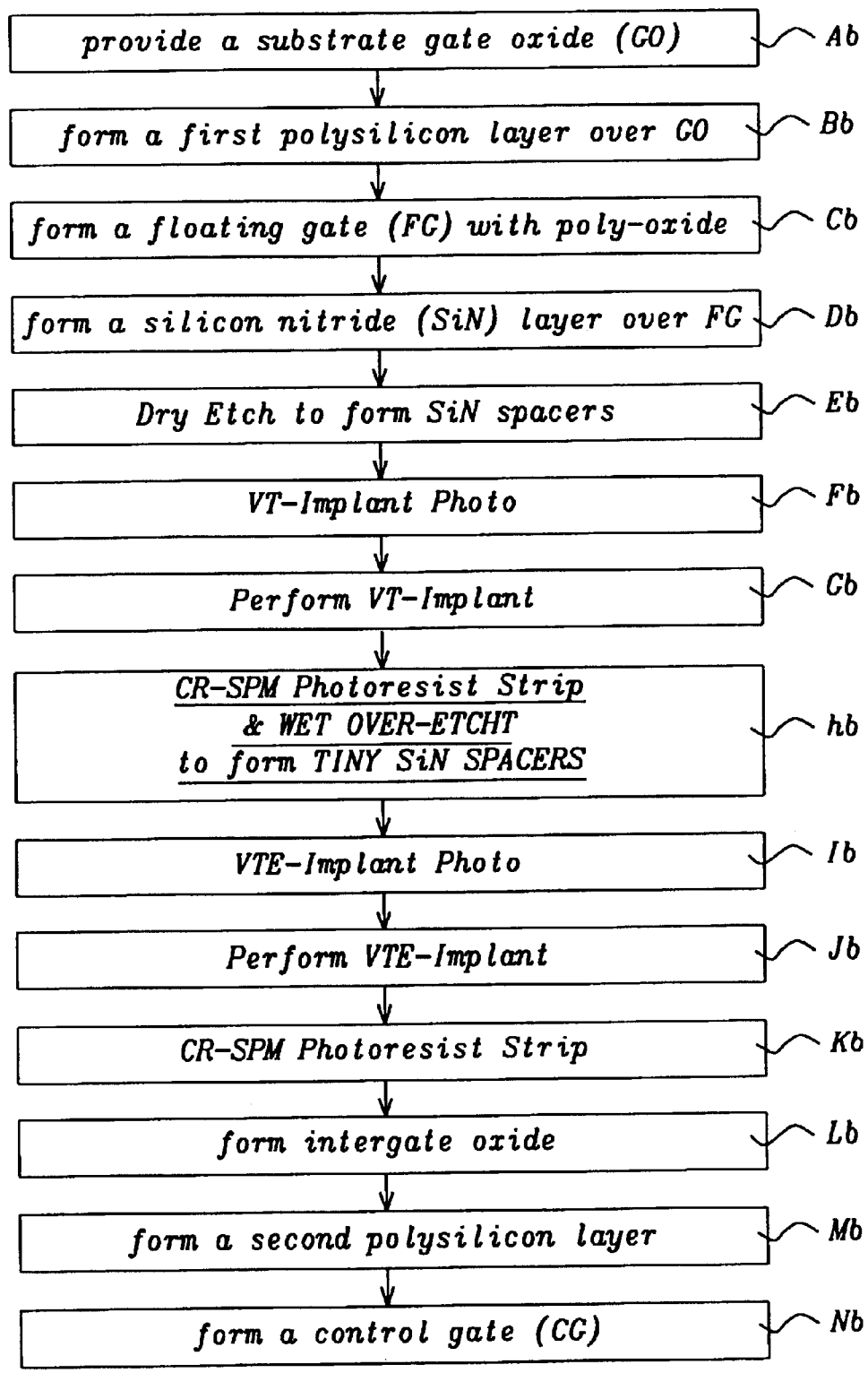
FIG. 3b is a Flow Chart showing the steps of forming tiny silicon nitride spacers for a split gate flash EPROM cell in a second embodiment where dry+wet over-etch method is used in simultaneously stripping off the VT-implant photomask and over-etching the first SiN spacers to form the tiny second SiN spacers of this invention.

Therefore, as another key aspect of the present invention, a second embodiment is disclosed in FIG. 3b where steps (Ab) through (Eb) are the same as those corresponding steps (Aa) through (Ea) of the first embodiment, but in the second embodiment, the wet over-etch of the tiny silicon nitride spacers is postponed until after the completion of the VT-implant. It is preferred that the VT-implant in step (Gb) is performed with ions $BF_2^+$ at a dosage level between about $1 \times 10^{12}$ to $3 \times 10^{12}$ atoms/cm$^2$ and energy between about 50 to 90 KEV, and thorough a photomask (not shown in the drawings) in step (Fb) spun to a thickness between about 13000 to 20000 Å. The photomask is then removed by stripping it in CR-SPM solution comprising ($H_2SO_4+H_2O_2$), namely, sulfuric acid and hydrogen peroxide. The same solution (185) is used to wet over-etch the first SiN spacers, (173) of FIG. 2f to form the tiny second SiN spacers, (177) of the present invention shown in FIG. 2h. The wet over-etch and stripping of the photomask are shown in the same combined step (Hb) of the Flow Chart in FIG. 3b. It will be appreciated by those skilled in the art that with the 10× improvement in the process window as shown in Table I above, the preferred tiny dimensions of SiN spacers (177) between about 200 to 250 Å, both in height as well as in width, can be controlled quite well with well defined shape.

The remaining steps, namely steps (Ja–Oa) for the first embodiment, and steps (Ib–Nb) for the second embodiment, for completing the forming of the split-gate flash EPROM of the invention are the same. It will be noted that the second embodiment has one less step than the first embodiment. Thus, a low threshold voltage (VTE) adjustment is performed through ion implantation-steps (Ja) and (Ib) of the first and second embodiments, respectively. First, a VTE-implant photomask is formed by spin coating the substrate with a photoresist to a thickness between about 13000 to 20000 Å. Then VTE-implant is performed using ions BF$_2^+$ at a dosage level between about $1 \times 10^{12}$ to $3 \times 10^{12}$ atoms/cm$^2$ and energy between about 50 to 90 KEV. Subsequently, the VTE-implant photomask is stripped using the CR-SPM solution as before.

Figure 2I:
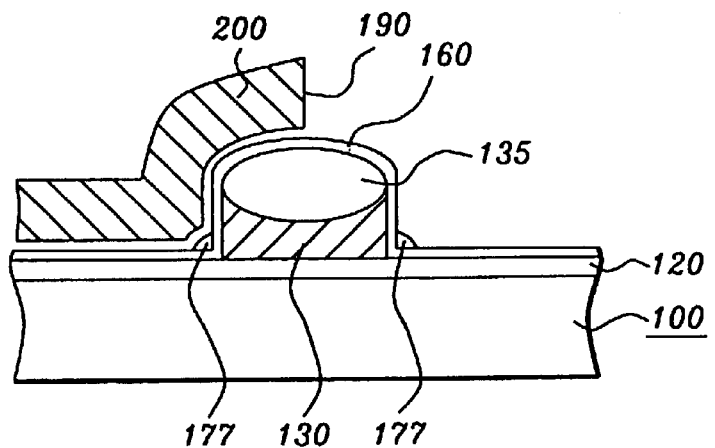
FIG. 2i is a cross-sectional view of a portion of a semiconductor substrate showing the completion of the split-gate flash memory cell of this invention where well-defined, tiny $Si_3N_4$ spacers are formed according to this invention.

As a penultimate step, intergate oxide layer (190) is formed over the substrate, including over the floating gate structure of FIG. 2i, followed by the forming of control gate (200). It is preferred that the intergate oxide layer is performed by thermal oxidation process to a thickness between about 80 to 150 Å. And the control gate is etched from a second polysilicon layer having a thickness between about 1200 to 2000 Å and formed from source SiH$_4$ in an LPCVD chamber at a temperature between about 600 to 650° C.

While the invention has been particularly shown and described with reference to the preferred embodiments thereof, it will be understood by those skilled in the art that various changes in form and details may be made without departing from the spirit and scope of the invention.

What is claimed is:

1. A method of forming tiny silicon nitride spacers for a flash EPROM cell, comprising the steps of:
   providing a substrate having a plurality of active and field regions defined;
   forming a gate oxide layer over said substrate;
   forming a first polysilicon layer over said gate oxide layer;
   forming a poly oxide layer over said first polysilicon layer;
   etching said first polysilicon layer to define a floating gate structure using the poly oxide layer;
   forming a tunnel oxide layer over said substrate, including over said polyoxide layer;
   forming a silicon nitride layer over said tunnel oxide layer;
   performing a dry etch of said silicon nitride (SiN) layer to form first SiN spacers along the vertical sidewalls of said floating gate structure;
   performing a wet over-etch of said first SiN spacers to form tiny second SiN spacers along the vertical sidewalls of said floating gate structure;
   performing a VT-implant;
   performing a VTE-implant;
   forming an intergate oxide layer over said floating gate;
   forming a second polysilicon layer over said poly oxide layer; and
   etching said second polysilicon layer to form a control gate over said intergate poly oxide layer.

2. The method of claim 1, wherein said forming said gate oxide layer is accomplished by thermal growth at a temperature between about 700 to 1000° C.

3. The method of claim 1, wherein said gate oxide layer has a thickness between about 50 to 120 Å.

4. The method of claim 1, wherein said forming said first polysilicon layer is accomplished with silicon source SiH$_4$ using LPCVD at a temperature between about 600 to 650° C.

5. The method of claim 1, wherein said first polysilicon layer has a thickness between about 1200 to 2000 Å.

6. The method of claim 1, wherein said etching said first polysilicon layer to define floating gate is accomplished with a recipe comprising Cl$_2$ and HBr using the poly oxide hard mask.

7. The method of claim 1, wherein said forming said poly oxide layer is accomplished by wet oxidation at a temperature between about 700 to 1000° C.

8. The method of claim 1, wherein said poly oxide layer has a thickness between about 1500 to 2000 Å.

9. The method of claim 1, wherein said tunnel oxide has a thickness between about 100 to 200 Å.

10. The method of claim 1, said forming said SiN layer is accomplished with LPCVD at a temperature between about 600 to 800° C. by reacting dichlorosilane (SiCl$_2$H$_2$) with ammonia (NH$_3$).

11. The method of claim 1, wherein said SiN layer has a thickness between about 180 to 250 Å.

12. The method of claim 1, wherein said performing said dry etch to form said first SiN spacers is accomplished with a recipe comprising gases SF$_6$, HBr, and O$_2$.

13. The method of claim 1, wherein said performing said wet over-etch to form said tiny second SiN spacers is accomplished in a hot phosphoric acid (H$_3$PO$_4$) solution, or in a Caro's-Sulfuric Peroxide mixture (H$_2$SO$_4$+H$_2$O$_2$), CR-SPM.

14. The method of claim 1, wherein said forming said VT-implant photomask is accomplished by spin coating a photoresist to a thickness between about 13000 to 20000 Å.

15. The method of claim 1, wherein said performing said VT-implant is accomplished with ions BF$_2^+$ at a dosage level between about $2 \times 10^{11}$ to $5 \times 10^{11}$ atoms/cm$^2$ and energy between about 50 to 90 KEV.

16. The method of claim 1, wherein said removing said VT-implant photomask is accomplished by using CR-SPM solution.

17. The method of claim 1, wherein said forming said VTE-implant photomask is accomplished by spin coating photoresist to a thickness between about 13000 to 20000 Å.

18. The method of claim 1, wherein said performing said VTE-implant is accomplished with ions BF$_2^+$ at a dosage level between about $1 \times 10^{12}$ to $3 \times 10^{12}$ atoms/cm$^2$ and energy between about 50 to 90 KEV.

19. The method of claim 1, wherein said removing said VTE-implant photomask is accomplished by using CR-SPM solution.

20. The method of claim 1, wherein said forming said intergate oxide layer is accomplished by thermal growth at a temperature between about 700 to 1000° C.

21. The method of claim 1, wherein said intergate oxide layer has a thickness between about 80 to 150 Å.

22. The method of claim 1, wherein said forming said second polysilicon layer over said intergate dielectric layer is accomplished with silicon source $SiH_4$ using LPCVD at a temperature between about 600 to 650° C.

23. The method of claim 1, wherein said second polysilicon layer has a thickness between about 1200 to 2000 Å.

24. The method of claim 1, wherein said etching said second, polysilicon layer to form said control gate is accomplished with a recipe comprising $Cl_2$ and HBr.

25. A method of forming tiny silicon nitride spacers for flash EPROM cell, comprising the steps of:

provided a substrate having a polysilicon floating gate and a polyoxide formed thereon;

forming tunnel oxide over said substrate, including over said polyoxide layer;

forming a silicon nitride (SiN) layer over said substrate, including over said polyoxide layer;

dry etching said SiN layer to form first SiN spacers along the vertical sidewalls of said floating gate;

forming a voltage threshold (VT)-implant photomask over said substrate;

performing a VT-implant;

performing wet etch to remove said VT-implant photomask and continuing to wet over-etch said SiN spacers to form tiny second SiN spacers;

forming a low voltage threshold (VTE)-implant photomask;

performing a VTE-implant;

removing said VTE-implant photomask;

forming an intergate oxide layer over said floating gate;

forming a second polysilicon layer over said poly oxide layer; and etching said second polysilicon layer to form a control gate over said intergate poly oxide layer.

26. The method of claim 25, wherein said tunnel oxide is formed by thermal oxidation process.

27. The method of claim 25, wherein said tunnel oxide has a thickness between about 100 to 200 Å.

28. The method of claim 25, said forming said SiN layer is accomplished with LPCVD at a temperature between about 600 to 800° C. by reacting dichlorosilane ($SiCl_2H_2$) with ammonia ($NH_3$).

29. The method of claim 25, wherein said SiN layer has a thickness between about 180 to 250 Å.

30. The method of claim 25, wherein said performing said dry etch to form said first SiN spacers is accomplished with a recipe comprising gases $SF_6$, HBr and $O_2$.

31. The method of claim 25, wherein said forming said VT-implant photomask is accomplished by spin coating photoresist to a thickness between about 13000 to 20000 Å.

32. The method of claim 25, wherein said performing said VT-implant is accomplished with ions $BF_2^+$ at a dosage level between about $2\times10^{11}$ to $5\times10^{11}$ atoms/cm$^2$ and energy between about 50 to 90 KEV.

33. The method of claim 25, wherein said performing said wet etch to remove said VT-implant photomask and continuing to wet over-etch said first SiN spacers to form said tiny second SiN spacers is accomplished using Caro's CR-SPM solution comprising sulfuric acid and hydrogen peroxide ($H_2SO_4+H_2O_2$).

34. The method of claim 25, wherein said forming said VTE-implant photomask is accomplished by spin coating photoresist to a thickness between about 13000 to 20000 Å.

35. The method of claim 25, wherein said performing said VTE-implant is accomplished with ions $BF_2^+$ at a dosage level between about $1\times10^{12}$ to $3\times10^{12}$ atoms/cm$^2$ and energy between about 50 to 90 KEV.

36. The method of claim 25, wherein said removing said VTE-implant photomask is accomplished using CR-SPM solution.

37. The method of claim 25, wherein said forming said intergate oxide layer is accomplished by thermal growth at a temperature between about 700 to 1000° C.

38. The method of claim 25, wherein said intergate oxide layer has a thickness between about 80 to 150 Å.

39. The method of claim 25, wherein said forming said second polysilicon layer over said intergate dielectric layer is accomplished with silicon source $SiH_4$ using LPCVD at a temperature between about 600 to 650° C.

40. The method of claim 25, wherein said second polysilicon layer has a thickness between about 1800 to 2000 Å.

41. The method of claim 25, wherein said etching said second polysilicon layer is accomplished with a recipe comprising $Cl_2$ and HBr.

* * * * *

UNITED STATES PATENT AND TRADEMARK OFFICE
CERTIFICATE OF CORRECTION

PATENT NO. : 6,706,601 B1
DATED : March 16, 2004
INVENTOR(S) : Hung-Hsin Liu et al.

It is certified that error appears in the above-identified patent and that said Letters Patent is hereby corrected as shown below:

<u>Title page,</u>
Item [75], Inventors, delete "Shih-Shun Chen", and replace with -- Shih-Shiung Chen --.

Signed and Sealed this

Eighth Day of March, 2005

JON W. DUDAS
*Director of the United States Patent and Trademark Office*